United States Patent
Nguyen et al.

(10) Patent No.: US 7,755,429 B2
(45) Date of Patent: Jul. 13, 2010

(54) SYSTEM AND METHOD FOR DYNAMIC DRAIN VOLTAGE ADJUSTMENT TO CONTROL LINEARITY, OUTPUT POWER, AND EFFICIENCY IN RF POWER AMPLIFIERS

(75) Inventors: Dung C. Nguyen, Anaheim, CA (US); Soon Yoon, Fullerton, CA (US); Ahmad Khanifar, Laguna Hills, CA (US); Don C. Devendorf, Carlsbad, CA (US)

(73) Assignee: Microelectronics Technology Inc. (TW)

( * ) Notice: Subject to any disclaimer, the term of this patent is extended or adjusted under 35 U.S.C. 154(b) by 45 days.

(21) Appl. No.: 12/031,249

(22) Filed: Feb. 14, 2008

(65) Prior Publication Data

US 2008/0211583 A1  Sep. 4, 2008

Related U.S. Application Data

(60) Provisional application No. 60/902,002, filed on Feb. 16, 2007.

(51) Int. Cl.
  *H03F 3/04* (2006.01)
(52) U.S. Cl. ..................................... 330/289; 330/297
(58) Field of Classification Search ................. 330/289, 330/297, 129
  See application file for complete search history.

(56) References Cited

U.S. PATENT DOCUMENTS 5,625,322 A   4/1997   Gourgue et al.
6,624,702 B1  9/2003   Dening
7,423,488 B2* 9/2008   Hunter et al. ............... 330/289
2002/0175764 A1 11/2002 Matsuura et al.
2005/0206447 A1* 9/2005 Yamazaki et al. ........... 330/129
2007/0024372 A1 2/2007  Hagen

FOREIGN PATENT DOCUMENTS

EP   1 569 330 A1   8/2005

OTHER PUBLICATIONS

European search report Application No. 08151486.1-1233 mailed Oct. 22, 2008.

* cited by examiner

*Primary Examiner*—Khanh V Nguyen
(74) *Attorney, Agent, or Firm*—Carlos R. Villamar; The Villamar Firm PLLC (57) ABSTRACT

A system and method for dynamic adjustment of drain or collector voltage of a power amplifier (PA), including a PA having a voltage input, a temperature sensor measuring ambient temperature of the PA, and an adaptive PA control processor that dynamically changes the input voltage based on the ambient temperature, achieving a desired peak power when the system is subjected to high temperatures. In a further embodiment, a power sensor measures output power of the PA, and the control processor dynamically changes the voltage based on output power when the system serves a large cell in a mobile communication infrastructure employing high power. In a further embodiment, a multistage PA and method include amplifier stages having drain or collector voltage inputs, wherein a voltage applied to the inputs are set so as to be proportional to the peak power requirements of each stage, enhancing overall efficiency.

18 Claims, 9 Drawing Sheets

SYSTEM AND METHOD FOR DYNAMIC DRAIN VOLTAGE ADJUSTMENT TO CONTROL LINEARITY, OUTPUT POWER, AND EFFICIENCY IN RF POWER AMPLIFIERS

CROSS REFERENCE TO RELATED DOCUMENTS

The present invention claims benefit of priority to U.S. Provisional Patent Application Ser. No. 60/902,002 of Khanifar et al., entitled "DYNAMIC PEAK-POWER ADJUSTMENT IN RF AMPLIFIERS," filed on Feb. 16, 2007, the disclosure of which is hereby incorporated by reference herein.

BACKGROUND OF THE INVENTION

1. Field of the Invention

The present invention generally relates to systems and methods for adjustment of radio frequency (RF) power amplifiers (PAs), and more particularly to a system and method for dynamic drain voltage adjustment to control linearity, output power, and efficiency in RF power amplifiers.

2. Discussion of the Background

Cellular phone systems rely on wireless communication between handsets and Basestations. A Remote Radiohead (RRH) is a transceiver subsystem that is used in conjunction with a cellular base station. The telephony and data traffic is sent to the RRH via an electrical or optical connection. The RRH generates one or more carrier frequencies and modulates them with the traffic signal. The modulated carries are amplified to the desired level in a power amplifier (PA). The PA unit is a self-standing functional-block that is formed by several amplifier stages. In a typical system, the PA is used in conjunction with digital predistortion or feedforward correction to achieve the linearity requirements. However, PA peak power capability will still set the performance limit for a given average power requirement and the system efficiency.

Power amplifier efficiency has been and continues to be the topic of intense research in electronic/electrical engineering discipline. The efficiency requirement is more stringent in battery operated systems and also where there are limitations in cooling an amplifier unit. A familiar example is the aforementioned RRHs, especially tower mounted units, in which convection cooling (i.e., fanless) is preferred for reliability reasons. Such systems that serve a large cell in mobile communications infrastructure require a relatively large radio frequency (RF) output power and hence a relatively high power amplifier, which means larger size. This limited convection cooling combined with a high power PA is a major issue driving PA efficiency for RHH applications. Moreover, due to the nature of modulation scheme used in such systems and the number of carriers used, the composite signal exhibits a large Peak to Average signal Ratio (PAR). This means the instantaneous signal power can peak to values much larger (e.g., 3-10 dB) than the average output power. This in turn means that the amplifier will have to be sized to handle much higher powers than the average output requirements with implications for the PA efficiency (i.e., the higher the PAR, the lower the efficiency). The heat generated by running a PA at low efficiency, but high power, prohibits their application in convectively cooled systems.

There are many power amplifier design techniques to address some of above problems, such as designs using feedback amplifiers, designs using class AB, D, E, and F amplifiers, and designs using envelope tracking amplifiers. However, each of the known techniques has some advantages and disadvantages. For example, the feedback amplifier has improved linearity, but the bandwidth is limited. The Class AB amplifiers have very wide bandwidth and good linearity, but high PAR efficiency is poor. The class D, E, and F amplifiers have very high efficiency, but suffer from very poor linearity.

SUMMARY OF THE INVENTION

Therefore, there is a need for a method and system that addresses the above and other problems. The above and other problems are addressed by the exemplary embodiments of the present invention, which provide improved radio transmitters that use a power amplifier (PA) which has controls to optimize linearity, output power, and efficiency. In a solid state radio frequency (RF) power amplifier, the linearity, output power, and efficiency are a function of bias voltage applied to the drain (e.g., of a power Field Effect Transistor (FET), such as a Laterally Diffused MOS (LDMOS) transistor, a gallium nitride transistor, etc.) or the collector (e.g., of bipolar junction (BJ) transistors) of the transistor used in the amplifier. For example, when the drain voltage of an LDMOS transistor is increased, the linearity of the PA will be higher and output power increases. However, at a given output power, increasing the drain voltage of an LDMOS transistor will decrease the PA efficiency. Thus, a dynamic drain voltage adjustment is employed that increases the drain voltage for providing extra linearity, as needed and thus optimizing PA efficiency. In exemplary embodiments, the bias drain voltage is controlled with respect to LDMOS transistors. However, the exemplary embodiments are applicable to other types of transistors, such bipolar junction transistors, gallium nitride transistors, and the like, as will be appreciated by those skilled in electrical arts. In one embodiment, the drain voltage is changed as a function of temperature in order to achieve a desired peak power, for example, when the amplifier system is subjected to high ambient temperature. In another embodiment, the drain voltage is changed as a function of output power, for example, when the amplifier system serves a large cell in a mobile communication infrastructure, and thus employing a large RF output power. In a further embodiment, the drain voltage is changed in each stage of an amplifier chain proportional to the peak power requirements of each stage, for example, to enhance PA chain efficiency. Still further embodiments are possible in view of the exemplary embodiments of the present invention.

Accordingly, in exemplary aspects of the present invention there is provided a system and method for dynamic adjustment of drain or collector voltage of a power amplifier, including a power amplifier having a drain or collector voltage input; a temperature sensor configured to measure ambient temperature of the power amplifier; and an adaptive power amplifier control processor configured to dynamically change a drain or collector voltage applied to the input of the power amplifier as a function of ambient temperature of the power amplifier measured by the temperature sensor to achieve a desired peak power when the system is subjected to higher than normal ambient temperature.

In further exemplary aspects of the present invention there is provided a system and method for dynamic adjustment of drain or collector voltage of a power amplifier, including a power amplifier having a drain or collector voltage input; a power sensor configured to measure output power of the power amplifier; and an adaptive power amplifier control processor configured to dynamically change a drain or collector voltage applied to the input of the power amplifier as a function of output power of the power amplifier measured by the power sensor when the system serves a large cell in a mobile communication infrastructure and employs a larger than normal radio frequency (RF) output power.

In further exemplary aspects of the present invention there is provided a multistage power amplifier and method, including a plurality of amplifier stages having respective drain or collector voltage inputs, wherein drain or collector voltage applied to the respective inputs of the amplifier stages are set in each stage so as to be proportional to the peak power requirements of each stage, whereby overall efficiency of the multistage power amplifier is enhanced.

Still other aspects, features, and advantages of the present invention are readily apparent from the following detailed description, by illustrating a number of exemplary embodiments and implementations, including the best mode contemplated for carrying out the present invention. The present invention is also capable of other and different embodiments, and its several details can be modified in various respects, all without departing from the spirit and scope of the present invention. Accordingly, the drawings and descriptions are to be regarded as illustrative in nature, and not as restrictive.

BRIEF DESCRIPTION OF THE DRAWINGS

The embodiments of the present invention are illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1A:
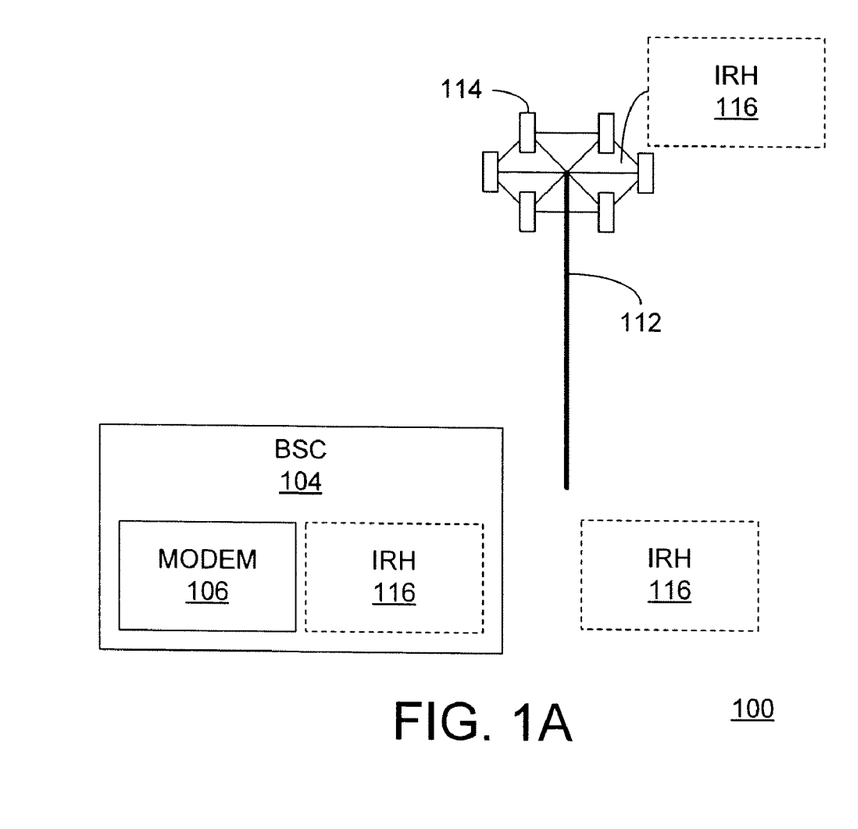
FIGS. 1A-1B illustrate an exemplary cell site for application of the present invention in a communications network.
Figure 1B:
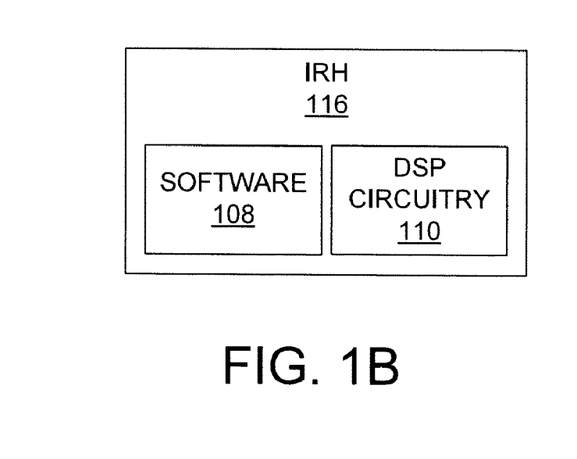

Referring now to the drawings, wherein like reference numerals designate identical or corresponding parts throughout the several views, and more particularly to FIGS. 1A-1B thereof, there is illustrated an exemplary cell site 100 for application of the present invention in a communications network, such as a cellular communications network, and the like. In FIGS. 1A-1B, the exemplary cell site 100 includes a base station controller (BSC) 104 (also referred to as a "Node B") and a cell tower 112. The BSC 104 includes a modem 106. The cell tower 112 includes one or more antennae 114 mounted to the top of the cell tower 112 for transmitting and receiving wireless communication signals. The cell site 100 also includes a transceiver or radio, for example, such as an integrated radio head (IRH) 116. The IRH 116 includes software 108, and circuitry 110 (e.g., a digital signal processor, etc.), and is configured for communicating over multiple network protocols. The IRH 116 also includes analog circuitry, and a power amplifier (not shown). As shown in FIG. 1A, the IRH 116 can be located either within the BSC 104 (e.g., on a card in a slot in a rack-mounted configuration), in a separate housing from the BSC 104 and connected to the antenna 114 of the cell tower through a lossy cable, or mounted at the top of the cell tower 112 near the antenna 114 in a tower-mounted configuration and that reduces the connection loss between the IRH 116 and the antenna 114.

Figure 1C:
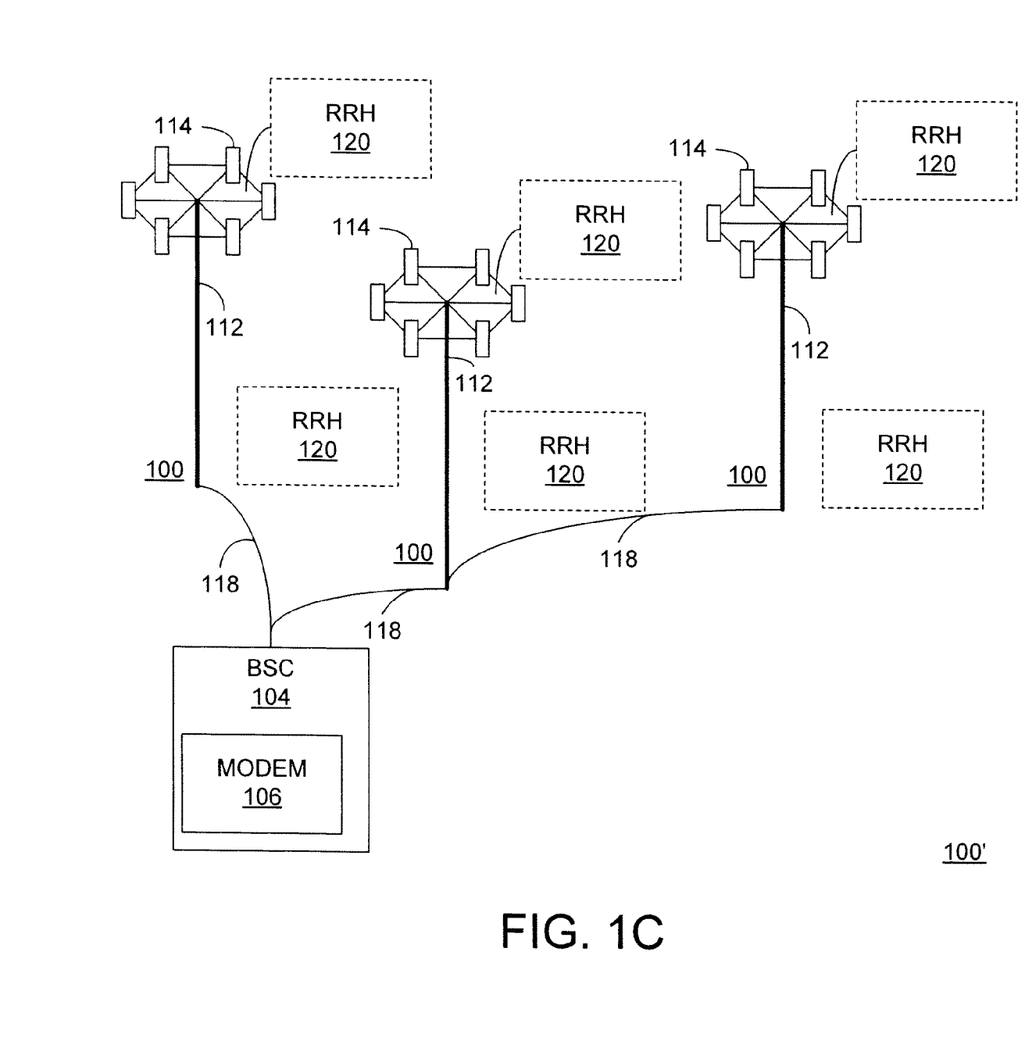
FIG. 1C-1D illustrates an exemplary system, including a cluster of cell sites.
Figure 1D:
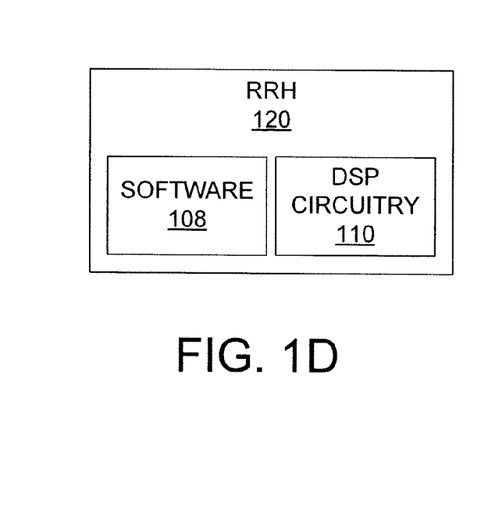

FIGS. 1C-1D illustrate an exemplary system 100', including a cluster of cell sites 100 in which there is a single BSC 104 connected by fiber optic lines 118 in a daisy chain or parallel configuration to multiple remote radio heads (RRHs) 120, wherein each RRH 120 is located at a different cell site 100. The term "remote" is used to indicate that the radio head 120 is not co-located with the BSC 104 at the cell site 100, but rather is located at a remote cell site. As with the IRH 116, each of the RRHs 120 includes the software 108 and the processing circuitry 110 for communicating over the multiple network protocols, and can be located at the base of the cell tower 112 at each cell site 100 or alternatively at the top of the cell tower 112 in a tower-mounted configuration, as shown in FIG. 1C.

The IRHs 116 and RRHs 120 of FIGS. 1A-1D include power amplifiers (PAs, not shown). The output power levels of the PAs may change over time as a function of the number of users. In general, as the number of users increases or the amount of traffic increases (e.g., if multiple users are downloading data), the output power levels increase. In addition, because each user is under power control, as the user gets closer to the cell site 100 or farther away from the cell site 100, the output power level transmitted to that user decreases or increases accordingly.

Figure 2:
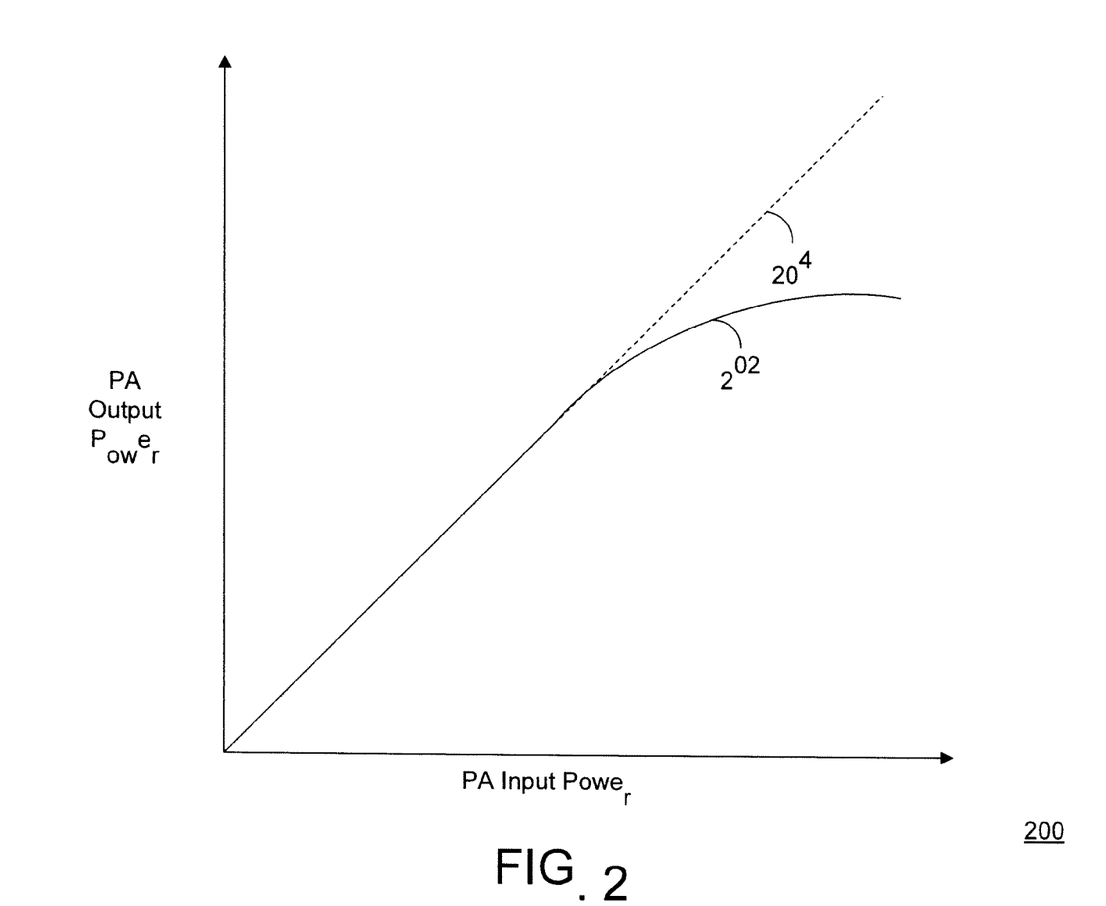
FIG. 2 illustrates an exemplary power amplifier characteristic curve of input power versus output power.

FIG. 2 illustrates an exemplary power amplifier characteristic curve 200 of input power (x-axis) versus output power (y-axis). In FIG. 2, at higher input power levels the curve compresses, as shown at 202, and becomes non-linear, so that the actual amount of output power is less than what is expected under ideal conditions, as shown at 204. Additionally, the power amplifier experiences memory effect distortion and phase distortion. These three PA characteristics are the major PA distortion effects and are collectively referred to herein as output power "distortion."

In historical second generation (2G) cellular communication services, class C PAs were used with a 50% natural efficiency. No linearization of the output power versus input power curve was required, because the output signal was provided at a constant amplitude. With current third generation (3G) cellular communication services, Gaussian-like signals are generated with large peak-to-average ratios, and class AB PAs are employed.

Current PAs are generally expensive and very power-consuming components in communication systems. PAs not only have non-linearity distortions, but also possess memory effects. While non-linearity distortions depend on the PA characteristics, the memory effects depend on signal characteristics (e.g., signal bandwidth and transmit power level).

The transmit signal is a modulated signal and thus includes various frequency content, for example, expressed as follows:

$$x(t) = \sum_i x_i(t, f_i)$$

When such a signal is passed through a digital to analog converter (DAC), radio frequency (RF) electronics and the PA, the signal undergoes different distortions: (1) Non-Linearity Distortion (e.g., due to amplifier stages and power level); (2) Amplitude distortions (e.g., due to non-ideal filtering); (3) Phase distortions (e.g., due to non-ideal filtering); and (4) Time Delay distortions (.e.g., due to group delay variations in filtering). In addition, the PA characteristics change in correspondence with changing transmit signals. For example, as the transmit signal is rapidly modulated, the thermal effects of the PA change, which cause the PA characteristics to change. Since the signal source is typically dynamic and the amplitude can vary (e.g., 5-10 dB) within a very short period (e.g., for High Speed Downlink Packet Access (HSDPA)), the PA gain and phase characteristics can change fairly rapidly.

Without linearization, the efficiency of the class AB PAs in 3G cellular communication services drops to 4%. Thus, there is a need to improve the efficiency of the PAs in 3G cellular communication services. Using analog techniques, efficiency can be improved to about 8%. Digital techniques can raise this efficiency to about 20%. However, there is still a need to improve PA efficiency to even greater levels, while maintaining acceptable Channel Power Leakage (CPL).

"Pre-distortion" is a known technique for applying a pre-distorted PA input signal to a PA to cancel out or compensate for the inherent distortion of the PA and improve the linearization and therefore the efficiency of the PA. However, previous digital implementations utilized digital signal processing (DSP) and software, which can be too slow for current PAs that can experience rapid changes to power levels.

Accordingly, the exemplary embodiments provide a novel technique, for example, including dynamic drain voltage adjustment for power amplifiers, such as Doherty type power amplifiers, and the like. However, the teachings of the exemplary embodiments can be applied to other types of PA's, as will be appreciated by those skilled in electrical arts. However, when the teachings of exemplary embodiments are applied to the Doherty structure, advantageously, the loss in efficiency also can be minimized.

Figure 3:
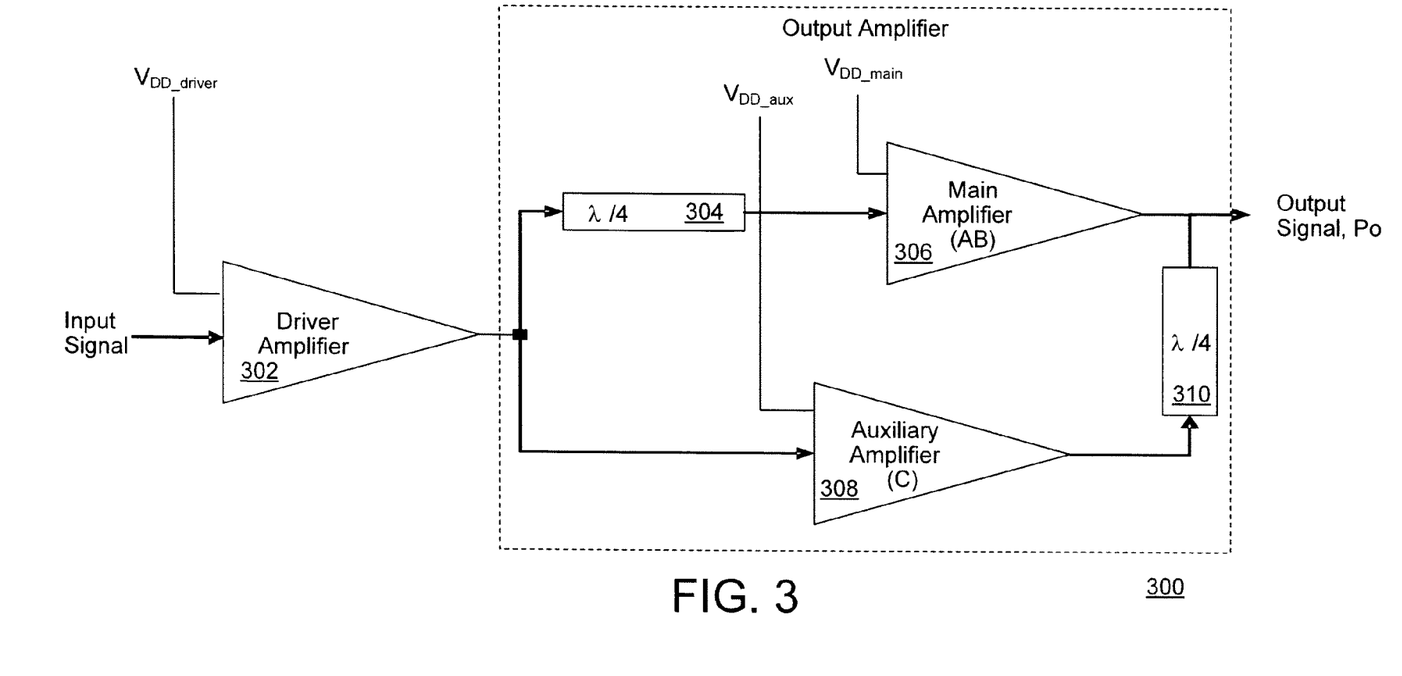
FIG. 3 illustrates an exemplary Doherty type power amplifier.

FIG. 3 illustrates an exemplary Doherty type power amplifier 300. In FIG. 3, the simplest configuration of the Doherty circuit 300 includes Main and Auxiliary amplifiers 306 and 308, respectively, connected a Driver amplifier 302. The amplifiers 306 and 308 are connected in parallel with their outputs coupled via a quarter-wave transmission line 310, which performs impedance transformation. Similarly, a quarter-wave transmission line 304 is employed between the Driver amplifier 302 and the Main amplifier 306. The Auxiliary amplifier 308 delivers current as the Main amplifier 306 saturates, thereby reducing the impedance seen at the output of the Main amplifier 306. As a result, the Main amplifier 306 delivers more current to the load while it is saturated because of the so called "load-pulling" effect. Since the Main amplifier 306 remains close to saturation for a range of, for example, 6 dB backed off from the maximum input power, the total efficiency of the system remains high over that range.

Figure 4:
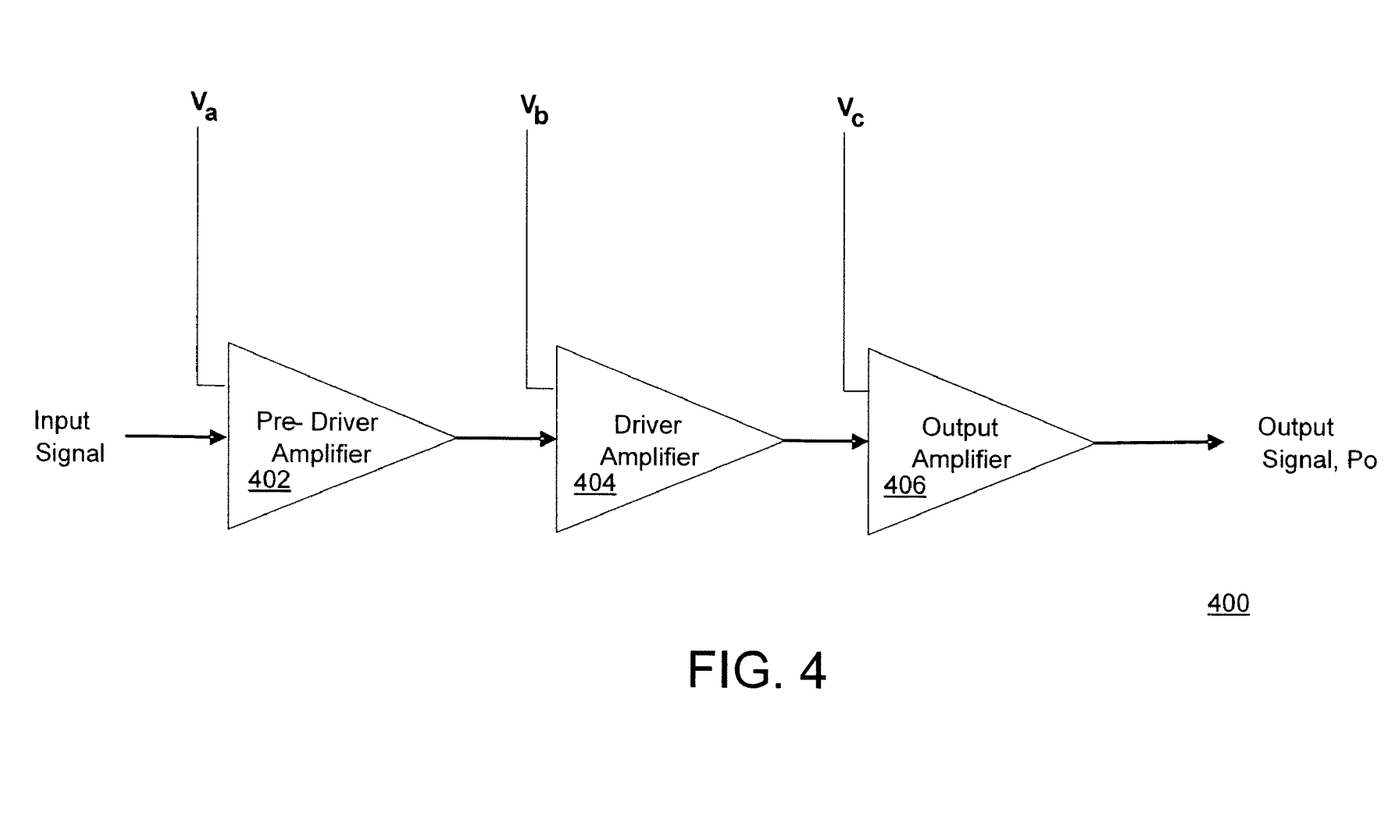
FIG. 4 illustrates an exemplary three stage power amplifier.

In most practical applications, each of the stages in a solid state power amplifier circuit is formed by an active device that is embedded in a passive circuit. For example, FIG. 4 illustrates an exemplary three stage power amplifier 400, including pre-driver amplifier 402, driver amplifier 404, and output amplifier 406, and respective drain voltage inputs $V_a$, $V_b$ and $V_c$. A Doherty PA typically includes only the driver 404 and the output 406 stages.

Figure 5:
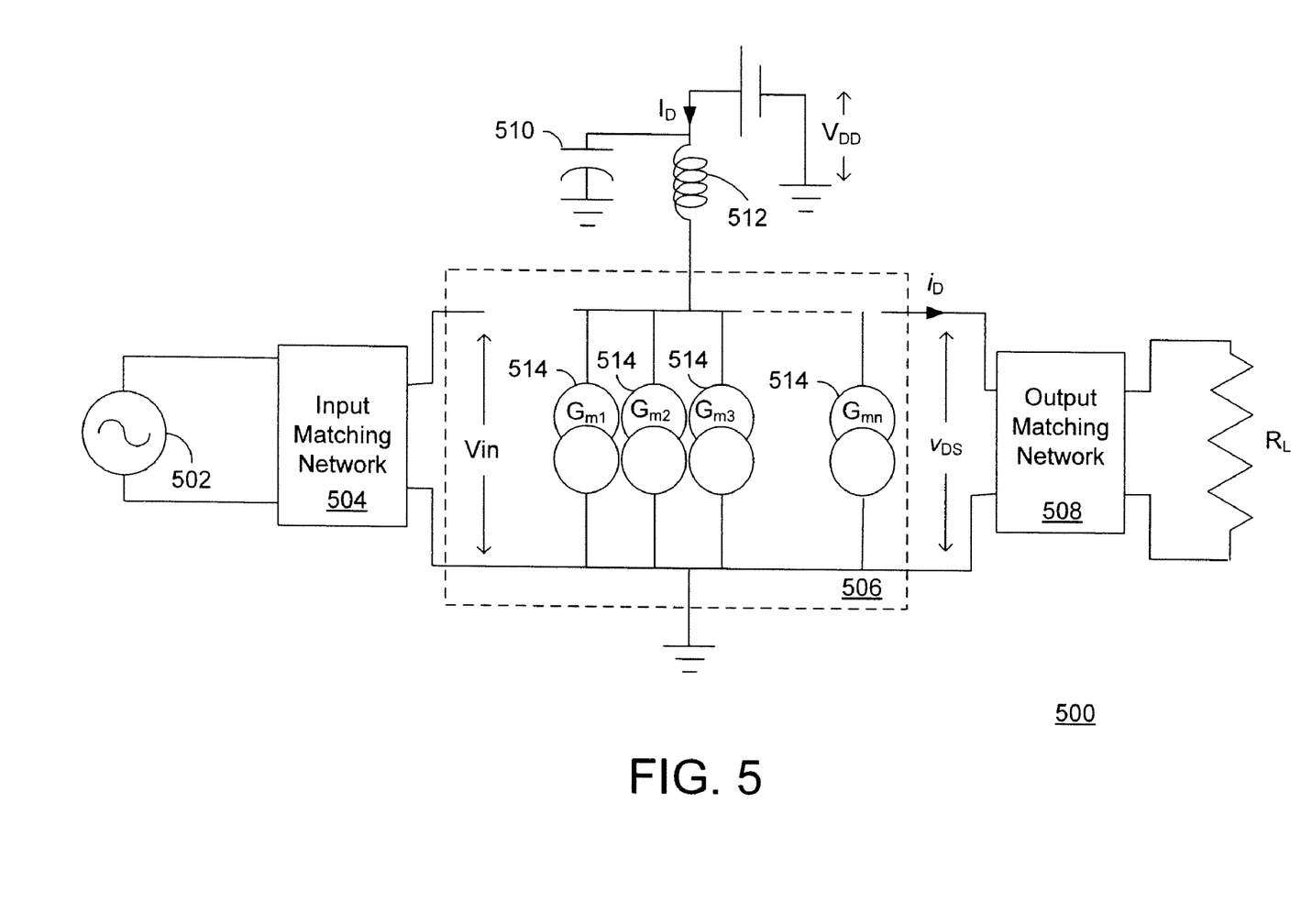
FIG. 5 illustrates a high level block diagram of an exemplary non-Doherty amplifier stage.

FIG. 5 illustrates a high level block diagram of an exemplary non-Doherty amplifier stage 500 (e.g., a field effect transistor amplifier with linear and non-linear current sources). In FIG. 5, the passive circuitry inside each amplifier forms matching circuits 504 and 508 and acts as a transformer, adjusting source and load impedances. The active devices or transistor 506 normally is either a bipolar transistor or a field effect transistor, and are also known as current or voltage controlled sources, respectively. The input signal 502 controls the flow of current from the power supply into the load $R_L$. The circuit of FIG. 5 also includes an RF choke circuit 510 and 512, and elements 514 corresponding to electrons flowing within the transistor 506.

The output voltage swing, $V_{DS}$, of the circuit 500 is capped by the maximum DC voltage available from the feeding power supply. The efficiency of the amplifier is defined as:

$$\eta = \frac{P_{Out}}{P_{DC}} = \frac{P_{Out}}{V_{DD}I_D} \quad (1)$$

It is well known that matching circuits for an RF amplifier can be designed to maximize the efficiency or the peak power capability. However, an amplifier without sufficient peak power capability will distort the applied signal and will exhibit a high degree of nonlinearity, whereas an amplifier operated with sufficient peak power capability will have minimal nonlinearity, but will be operating much more inefficiently. Therefore, efficiency and linearity are mutually exclusive and inversely related. Nonetheless, in practical operational scenarios, efficiency and linearity can take precedence over each other. For example, in convection cooled systems, such as a tower mounted radio transceiver, and the like, the PA efficiency is the dominant consideration, and every effort is made to optimize the efficiency for normal operation. Such outdoor units can be exposed to extreme temperatures (e.g., in the range from −40 to +55 degree centigrade). At higher temperatures, for fixed PA bias settings, the amplifier peak power will be reduced, due to the nature of transistors, making the PA more non-linear at high power. However, the peak power and hence linearity can be improved by increasing the bias voltage of the drain.

Figure 6:
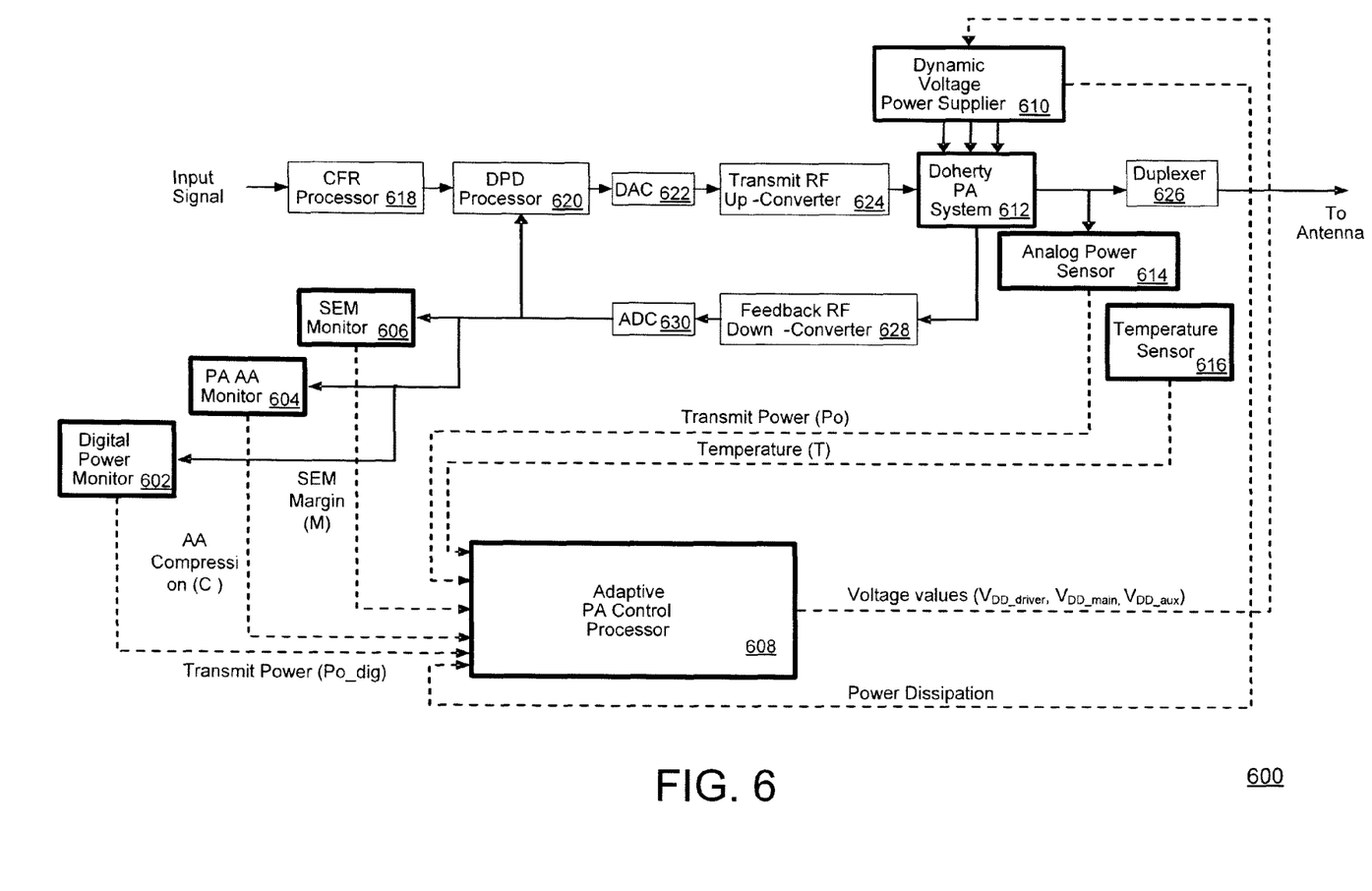
FIG. 6 illustrates a detailed block diagram of an exemplary adaptive system.

FIG. 6 illustrates a detailed block diagram of an exemplary adaptive system 600 that can be used to solve the above and other problems. In FIG. 6, the system 600 is configured as a nominal digital predistortion system with the addition of sensors and monitors used to control the voltages of PA chain elements 612. The PA 612 input comes from modem data which has been Peak to Average signal Ratio (PAR) or crest factor (CFR) reduced by a CFR processor 618, predistorted by a DPD Processor 620, converted to an analog signal by a Digital to Analog Converter (DAC) 622, and upconverted to the required RF frequency by a transmit RF upconverter 624.

A feedback output from the PA 612 is downconverted by a feedback RF downconverter 628, digitized by an Analog to Digital Converter (ADC) 630, and used in the DPD Processor 620, as well as sensors 602-606. The other PA 612 output goes to a Duplexer 626 and then to the antenna 114. An optional Analog Power Sensor 614 at the PA 612 output, and a temperature sensor 616 in or near the PA 612, supply inputs to an Adaptive PA Control Processor 608. Output power also can be determined digitally via a Digital Power Monitor 602. A Spectral Emissions Measurement (SEM) monitor 606 checks the level of spectral emissions in adjacent channels, for example, using digital signal processing and reports the measured levels to the Adaptive PA Control Processor 608. A PA Amplitude to Amplitude (AA) Monitor 604 digitally analyzes the transmit amplitude to the receive amplitude to check for PA 612 compression. The results of the digital monitors 602-606 are also sent to the Adaptive PA Control Processor 608, which provides control voltage values $V_{DD\_driver}$, $V_{DD\_main}$, $V_{DD\_aux}$ to the PA 612 via a Dynamic Voltage Power Supplier 610. The Dynamic Voltage Power Supplier 610 provides power dissipation information to the Adaptive PA Control Processor 608. In further exemplary embodiments, the exemplary sensors of the system 600 can be replaced with any other suitable sensors, parameters or computations that can be employed to determine how to set the bias voltages.

When the peak power is reduced due to increased temperature, the resulting nonlinearity will be apparent in the PA AA monitor 604. The monitor 604 checks whether the PA 612 is compressing by comparing the transmitted amplitude to the time-aligned feedback amplitude. When the PA 612 begins to compress, the ratio of the time-aligned larger transmit and feedback amplitudes will be smaller than the ratio of smaller amplitudes. Too much compression can result in violation of the spectral emissions mask. To increase linearity, it is possible to increase the $V_{DD\_aux}$ and if necessary $V_{DD\_main}$ of the Doherty Power Amplifier 612 to recover the loss of peak power. Both can be increased simultaneously or independently. As can be seen form equation (1) above, $V_{DD}$ is inversely related to efficiency, so that an increase in $V_{DD}$ results in decreasing of the efficiency.

Equation 2 below shows the efficiency equation for the Doherty PA 300:

$$\eta = \frac{P_{Out}}{P_{DC}} = \frac{P_{Out}}{V_{DD\_main} I_{D\_main} + V_{DD\_aux} I_{D\_aux}} \quad (2)$$

In a Doherty power amplifier configuration, the current draw of the Auxiliary amplifier 308 is much less than the current draw from the Main amplifier 306. Since $I_{D\_main}$ is much larger than $I_{D\_aux}$, the increase in $V_{DD\_aux}$ will not affect the efficiency as much as increasing $V_{DD\_main}$. So to the extent possible, $V_{DD\_aux}$ is adjusted while $V_{DD\_main}$ remains constant. This is a benefit of using a Doherty PA and employing the adaptive control scheme of the exemplary embodiments. In addition, in further exemplary embodiments, $V_{DD\_driver}$ also can be adjusted, as needed.

The PA chassis temperature is normally monitored as an operational system-parameter via the temperature sensor 616. Through monitoring PA chassis temperature and system performance, it is possible to determine the point where the system's linearity performance deteriorates beyond an acceptable level, as a result of increasing temperatures. Under the $V_{DD}$ control processing, it is possible then to increase the $V_{DD}$ values to counter the peak power loss and the resultant loss of linearity. This allows the PA 612 to be run more efficiently at cooler temperatures, since instead of setting the voltages to fixed values in order to work under the worst case, advantageously, the voltages can be optimized as a function of temperature.

Figure 7:
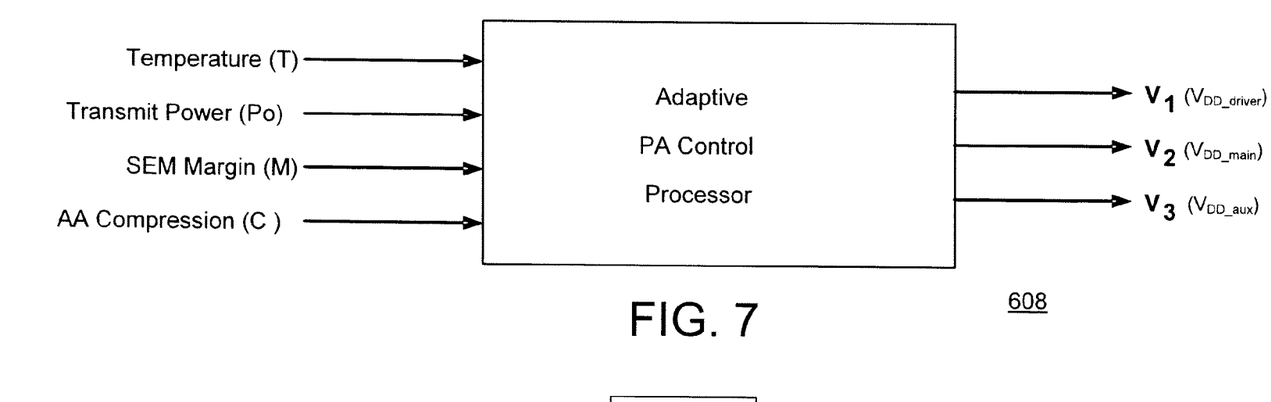
FIG. 7 illustrates an exemplary Adaptive Power Amplifier (PA) Control Processor.
Figure 8:
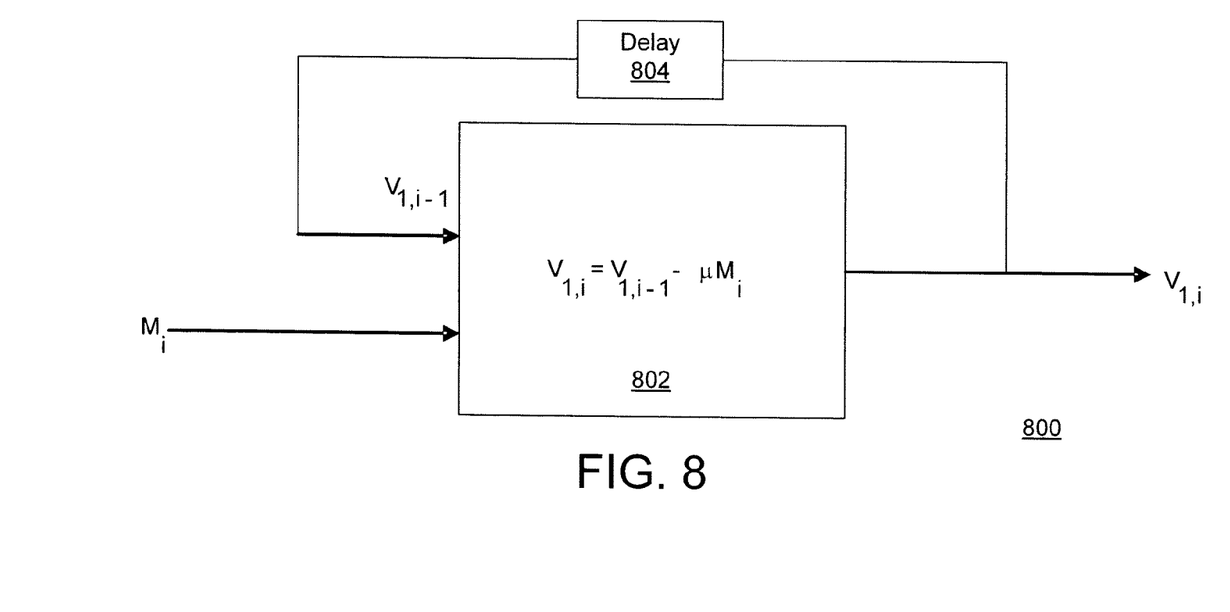
FIG. 8 illustrates a simplified example of an exemplary control loop.

FIG. 7 further illustrates the exemplary Adaptive PA Control Processor 608, which monitors system temperature, transmit power, SEM margin, AA Compression, and the like, to determine the optimum control voltage values $V_{DD\_driver}$, $V_{DD\_main}$, $V_{DD\_aux}$ FIG. 8 illustrates a simplified example of an exemplary control loop 800. In FIG. 8, as the spectral emissions mask margin $M_i$ decreases and goes negative, the bias voltage $V_{l,i}$ (e.g., $V_{DD\_aux}$) is increased slowly (e.g., depending on the size of μ) by block 802 until the margin $M_i$ goes back to zero. The limits to the voltage $V_{l,i}$ can be applied in both directions. The output $V_{l,i}$ of block 802 with delay 804 can be fed back as an input $V_{l,i-1}$. Similarly, other control loops that are functions of the other sensor inputs to the Adaptive PA Control Processor 608 can be implemented to ensure optimal PA operation, as will be appreciated by those skilled in electrical arts. Accordingly, in further exemplary embodiments, such exemplary controls can be implemented with control loops and logic, such as in the example of FIG. 8, or using lookup tables and logic, and the like, as will be appreciated by those skilled in electrical arts.

Advantageously, with the exemplary embodiments, voltages $V_{DD\_driver}$, $V_{DD\_main}$, and $V_{DD\_aux}$ can be controlled to optimize the power amplifier in meeting, for example, the desired output power, dissipation power, Adjacent Channel Power Ratio (ACPR) performance, PA operation compression point, and the like. For example, when the data traffic is sent over to the RRH 120, the RRH 120 generates one or more carrier frequencies with acceptable PAR under the Crest Factor Reduction Processor (CFR processor 618) to meet the Error Vector Magnitude (EVM) requirement. The modulated carriers are amplified to the desired level in the power amplifier 612. In the case where the RRH 120 is servicing a large and busy sector, the power amplifier 612 may transmit at or close to full power continuously. Under the feedback path from the PA 612, the exemplary embodiments can monitor the performance of the PA 612, for example, computing PA 612 performance measures, such as the SEM, the AM-AM profile, and the like. With this information, the exemplary system 600 uses the Adaptive PA Control processor 608, or the like, to adjust the drain voltages, $V_{DD\_driver}$, $V_{DD\_main}$, and $V_{DD\_aux}$, to maintain high efficiency and linearity in system level applications with high throughput. In this case, if temperature is not causing compression, it is much more likely that independent control of the driver voltages and possibly only control of $V_{DD\_aux}$ is sufficient to boost linearity, as needed.

When employing multiple amplifier stages, as shown in FIG. 4 or in a two stage Doherty configuration, overall efficiency can be improved by optimizing each of the stages 402-406 by adjusting respective bias voltages $V_a$, $V_b$ and $V_c$. The overall PA design methodology starts with estimating the peak power for each stage 402-406. Next, by employing any suitable nonlinear simulations, it is then possible to determine the size of each device 402-406 in the amplifier chain 400. However, in PA applications using commercial devices, the device sizes are fixed and often the optimum size is not available. Advantageously, with the exemplary embodiments, it is possible to reduce the $V_{DD}$ required for each stage 402-406 as a design variable to reach the required peak power, while simultaneously optimizing efficiency.

Figure 9:
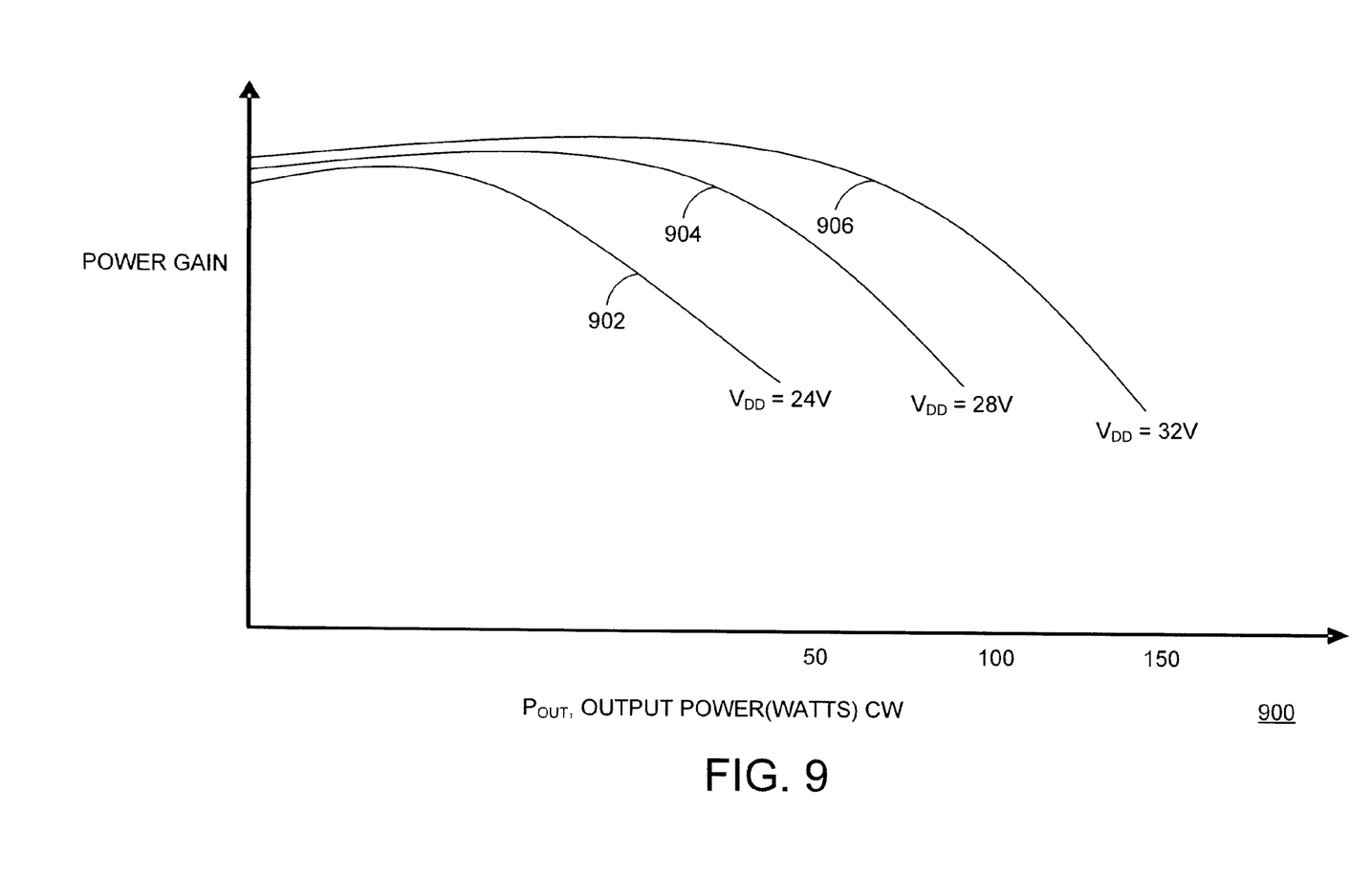
FIG. 9 illustrates exemplary gain profile curves for a given device over different $V_{DD}$ settings.

FIG. 9 illustrates exemplary gain profile curves 900 of drain voltage versus output power for a given device over different $V_{DD}$ settings. In FIG. 9, for a 24V bias for curve 902, as the input power increases, and thus the output power increases, one would like the device to have a constant gain. The 24V curve 902 shows that as the input increases and thus the output increases, the gain of the amplifier reduces substantially as the output reaches 50 Watts. Accordingly, if this stage needs to be linear up to 50 Watts, the exemplary system 600 can employ a 28V or 32V bias to avoid compression (e.g., drooping gain) in this stage, and as shown by respective curves 904 and 906. Advantageously, with the exemplary embodiments, the amplifier is not drawing more current than necessary in order to handle the output power required by that stage. Accordingly, individual dynamic adjustments can be made for each of the stages 402-406.

In the RRH 120, the PA module temperature is a parameter reported, for example, to a built-in microprocessor in charge of automatic gain control, and other system parameters/controls. Advantageously, such a microprocessor can be programmed with an appropriate algorithm, according to the teachings of the exemplary embodiments, to vary the DC supply (e.g., drain voltage) to increase the peak power lost, due to high temperature or other circumstances, or decrease the peak power, due to low temperature or other circumstance, and therefore maintain device linearity.

The exemplary method and system to compensate against temperature and other factors can be configured with analog and/or digital circuits, in the power supply unit or in a system controller, as will be appreciated by those skilled in electrical arts. The input data to trigger the adjustment can be predetermined by measurement or can be calculated in real or near real time by measuring linearity performance. The various implementations can be performed, for example, by utilizing a look-up table or other suitable algorithms, and the like, residing in the system controller, and the like.

In further exemplary embodiments, the power amplifier spectral emissions mask (SEM) monitor 606 is configured to digitally analyze the power amplifier 612 feedback signal to determine power amplifier linearization performance, wherein the Adaptive PA Control processor 608 is configured to dynamically change the drain or collector voltage applied to the input of the power amplifier 612 as a function of the determined linearization performance.

In further exemplary embodiments, the Adaptive PA Control processor 608 is configured to dynamically change the drain or collector voltage applied to the input of the power amplifier 612 as a function of analysis of the output power over time, for example, based on both current or real time measurements and older or historical measurements, for example, performed by the Digital Power Monitor 602, the Analog Power Sensor 614, and the like. Advantageously, such signal history or traffic pattern can be employed to predict the PA 612 power levels and adjust the bias $V_{dd}$ voltages in a predictable way. For example, fluctuations of the bias voltages can be avoided when it is determined that the utilization of the bandwidth or equivalently the PA 612 output power is near a maximum continually, such as during rush hour, and the like.

The above-described devices and subsystems of the exemplary embodiments can include, for example, any suitable servers, workstations, PCs, laptop computers, PDAs, Internet appliances, handheld devices, cellular telephones, wireless devices, other devices, and the like, capable of performing the processes of the exemplary embodiments. The devices and subsystems of the exemplary embodiments can communicate with each other using any suitable protocol and can be implemented using one or more programmed computer systems or devices.

One or more interface mechanisms can be used with the exemplary embodiments, including, for example, Internet access, telecommunications in any suitable form (e.g., voice, modem, and the like), wireless communications media, and the like. For example, employed communications networks or links can include one or more wireless communications networks, cellular communications networks, G3 communications networks, Public Switched Telephone Network (PSTNs), Packet Data Networks (PDNs), the Internet, intranets, a combination thereof, and the like.

It is to be understood that the devices and subsystems of the exemplary embodiments are for exemplary purposes, as many variations of the specific hardware used to implement the exemplary embodiments are possible, as will be appreciated by those skilled in the relevant art(s). For example, the functionality of one or more of the devices and subsystems of the exemplary embodiments can be implemented via one or more programmed computer systems or devices.

To implement such variations as well as other variations, a single computer system or device can be programmed to perform the special purpose functions of one or more of the devices and subsystems of the exemplary embodiments. On the other hand, two or more programmed computer systems or devices can be substituted for any one of the devices and subsystems of the exemplary embodiments. Accordingly, principles and advantages of distributed processing, such as redundancy, replication, and the like, also can be implemented, as desired, to increase the robustness and performance of the devices and subsystems of the exemplary embodiments.

The devices and subsystems of the exemplary embodiments can store information relating to various processes described herein. This information can be stored in one or more memories, such as a hard disk, optical disk, magneto-optical disk, RAM, and the like, of the devices and subsystems of the exemplary embodiments. One or more databases of the devices and subsystems of the exemplary embodiments can store the information used to implement the exemplary embodiments of the present inventions. The databases can be organized using data structures (e.g., records, tables, arrays, fields, graphs, trees, lists, and the like) included in one or more memories or storage devices listed herein. The processes described with respect to the exemplary embodiments can include appropriate data structures for storing data collected and/or generated by the processes of the devices and subsystems of the exemplary embodiments in one or more databases thereof.

All or a portion of the devices and subsystems of the exemplary embodiments can be conveniently implemented using one or more general purpose computer systems, microprocessors, digital signal processors, micro-controllers, and the like, programmed according to the teachings of the exemplary embodiments of the present inventions, as will be appreciated by those skilled in the computer and software arts. Appropriate software can be readily prepared by programmers of ordinary skill based on the teachings of the exemplary embodiments, as will be appreciated by those skilled in the software art. Further, the devices and subsystems of the exemplary embodiments can be implemented on the World Wide Web. In addition, the devices and subsystems of the exemplary embodiments can be implemented by the preparation of application-specific integrated circuits or by interconnecting an appropriate network of conventional component circuits, as will be appreciated by those skilled in the electrical art(s). Thus, the exemplary embodiments are not limited to any specific combination of hardware circuitry and/or software.

Stored on any one or on a combination of computer readable media, the exemplary embodiments of the present inventions can include software for controlling the devices and subsystems of the exemplary embodiments, for driving the devices and subsystems of the exemplary embodiments, for enabling the devices and subsystems of the exemplary embodiments to interact with a human user, and the like. Such software can include, but is not limited to, device drivers, firmware, operating systems, development tools, applications software, and the like. Such computer readable media further can include the computer program product of an embodiment of the present inventions for performing all or a portion (if processing is distributed) of the processing performed in implementing the inventions. Computer code devices of the exemplary embodiments of the present inventions can include any suitable interpretable or executable code mechanism, including but not limited to scripts, interpretable programs, dynamic link libraries (DLLs), Java classes and applets, complete executable programs, Common Object Request Broker Architecture (CORBA) objects, and the like. Moreover, parts of the processing of the exemplary embodiments of the present inventions can be distributed for better performance, reliability, cost, and the like.

As stated above, the devices and subsystems of the exemplary embodiments can include computer readable medium or memories for holding instructions programmed according to the teachings of the present inventions and for holding data structures, tables, records, and/or other data described herein. Computer readable medium can include any suitable medium that participates in providing instructions to a processor for execution. Such a medium can take many forms, including but not limited to, non-volatile media, volatile media, transmission media, and the like. Non-volatile media can include, for example, optical or magnetic disks, magneto-optical disks, and the like. Volatile media can include dynamic memories, and the like. Transmission media can include coaxial cables, copper wire, fiber optics, and the like. Transmission media also can take the form of acoustic, optical, electromagnetic waves, and the like, such as those generated during radio frequency (RF) communications, infrared (IR) data communications, and the like. Common forms of computer-readable media can include, for example, a floppy disk, a flexible disk, hard disk, magnetic tape, any other suitable magnetic medium, a CD-ROM, CDRW, DVD, any other suitable optical medium, punch cards, paper tape, optical mark sheets, any other suitable physical medium with patterns of holes or other optically recognizable indicia, a RAM, a PROM, an EPROM, a FLASH-EPROM, any other suitable memory chip or cartridge, a carrier wave or any other suitable medium from which a computer can read.

While the present inventions have been described in connection with a number of exemplary embodiments, and implementations, the present inventions are not so limited, but rather cover various modifications, and equivalent arrangements, which fall within the purview of the present claims.

What is claimed is:

1. A system for dynamic adjustment of drain or collector voltage of a power amplifier, the system comprising:
   a power amplifier having a drain or collector voltage input;
   a temperature sensor configured to measure ambient temperature of the power amplifier;
   an adaptive power amplifier control processor configured to dynamically change a drain or collector voltage applied to the input of the power amplifier as a function of ambient temperature of the power amplifier measured by the temperature sensor to achieve a desired peak power when the system is subjected to higher than normal ambient temperature; and
   a power amplifier amplitude to amplitude (AA) monitor configured to digitally analyze a transmit amplitude of the power amplifier to a receive amplitude of the power amplifier to determine output signal compression of the power amplifier,
   wherein the adaptive power amplifier control processor is configured to dynamically change the drain or collector voltage applied to the input of the power amplifier as a function of the determined output signal compression.

2. The system of claim 1, wherein the power amplifier includes a power field effect transistor (FET), including one of a laterally diffused MOS (LDMOS) transistor, and a gallium nitride transistor, and
   the adaptive power amplifier control processor is configured to dynamically change the drain voltage applied to the input of the power amplifier.

3. The system of claim 1, wherein the power amplifier includes a bipolar junction (BJ) transistor, and
   the adaptive power amplifier control processor is configured to dynamically change the collector voltage applied to the input of the power amplifier.

4. A system for dynamic adjustment of drain or collector voltage of a power amplifier, the system comprising:
   a power amplifier having a drain or collector voltage input;
   a temperature sensor configured to measure ambient temperature of the power amplifier;
   an adaptive power amplifier control processor configured to dynamically change a drain or collector voltage applied to the input of the power amplifier as a function of ambient temperature of the power amplifier measured by the temperature sensor to achieve a desired peak power when the system is subjected to higher than normal ambient temperature; and
   a power amplifier spectral emissions mask (SEM) monitor configured to digitally analyze a feedback signal of the power amplifier to determine power amplifier linearization performance,
   wherein the adaptive power amplifier control processor is configured to dynamically change the drain or collector voltage applied to the input of the power amplifier as a function of the determined linearization performance.

5. The system of claim 4, wherein the power amplifier includes a power field effect transistor (FET), including one of a laterally diffused MOS (LDMOS) transistor, and a gallium nitride transistor, and
   the adaptive power amplifier control processor is configured to dynamically change the drain voltage applied to the input of the power amplifier.

6. The system of claim 4, wherein the power amplifier includes a bipolar junction (BJ) transistor, and
   the adaptive power amplifier control processor is configured to dynamically change the collector voltage applied to the input of the power amplifier.

7. A method for dynamic adjustment of drain or collector voltage of a power amplifier having a drain or collector voltage input, the method comprising:
   measuring by a temperature sensor ambient temperature of the power amplifier;
   dynamically changing by an adaptive power amplifier control processor a drain or collector voltage applied to the input of the power amplifier as a function of ambient temperature of the power amplifier measured by the temperature sensor to achieve a desired peak power when subjected to higher than normal ambient temperature;
   digitally analyzing by a power amplifier amplitude to amplitude (AA) monitor a transmit amplitude of the power amplifier to a receive amplitude of the power amplifier to determine output signal compression of the power amplifier; and
   dynamically changing the adaptive power amplifier control processor the drain or collector voltage applied to the input of the power amplifier as a function of the determined output signal compression.

8. The method of claim 7, wherein the power amplifier includes a power field effect transistor (FET), including one of a laterally diffused MOS (LDMOS) transistor, and a gallium nitride transistor, and the method further comprises dynamically changing by the adaptive power amplifier control processor the drain voltage applied to the input of the power amplifier.

9. The method of claim 7, wherein the power amplifier includes a bipolar junction (BJ) transistor, and the method further comprises dynamically changing by the adaptive power amplifier control processor the collector voltage applied to the input of the power amplifier.

10. A computer program product for dynamic adjustment of drain or collector voltage of a power amplifier having a drain or collector voltage input, and including one or more computer readable instructions embedded on a tangible computer readable medium and configured to cause one or more computer processors to perform the steps of:

measuring by a temperature sensor ambient temperature of the power amplifier;

dynamically changing by an adaptive power amplifier control processor a drain or collector voltage applied to the input of the power amplifier as a function of ambient temperature of the power amplifier measured by the temperature sensor to achieve a desired peak power when subjected to higher than normal ambient temperature;

digitally analyzing by a power amplifier amplitude to amplitude (AA) monitor a transmit amplitude of the power amplifier to a receive amplitude of the power amplifier to determine output signal compression of the power amplifier; and dynamically changing the adaptive power amplifier control processor the drain or collector voltage applied to the input of the power amplifier as a function of the determined output signal compression.

11. The computer program product of claim 10, wherein the power amplifier includes a power field effect transistor (FET), including one of a laterally diffused MOS (LDMOS) transistor, and a gallium nitride transistor, and further comprising dynamically changing by the adaptive power amplifier control processor the drain voltage applied to the input of the power amplifier.

12. The computer program product of claim 10, wherein the power amplifier includes a bipolar junction (BJ) transistor, and further comprising dynamically changing by the adaptive power amplifier control processor the collector voltage applied to the input of the power amplifier.

13. A method for dynamic adjustment of drain or collector voltage of a power amplifier having a drain or collector voltage input, the method comprising:

measuring by a temperature sensor ambient temperature of the power amplifier;

dynamically changing by an adaptive power amplifier control processor a drain or collector voltage applied to the input of the power amplifier as a function of ambient temperature of the power amplifier measured by the temperature sensor to achieve a desired peak power when subjected to higher than normal ambient temperature;

digitally analyzing by a power amplifier spectral emissions mask (SEM) monitor a feedback signal of the power amplifier to determine power amplifier linearization performance; and dynamically changing by the adaptive power amplifier control processor the drain or collector voltage applied to the input of the power amplifier as a function of the determined linearization performance.

14. The method of claim 13, wherein the power amplifier includes a power field effect transistor (FET), including one of a laterally diffused MOS (LDMOS) transistor, and a gallium nitride transistor, and the method further comprises dynamically changing by the adaptive power amplifier control processor the drain voltage applied to the input of the power amplifier.

15. The method of claim 13, wherein the power amplifier includes a bipolar junction (BJ) transistor, and the method further comprises dynamically changing by the adaptive power amplifier control processor the collector voltage applied to the input of the power amplifier.

16. A computer program product for dynamic adjustment of drain or collector voltage of a power amplifier having a drain or collector voltage input, and including one or more computer readable instructions embedded on a tangible computer readable medium and configured to cause one or more computer processors to perform the steps of:

measuring by a temperature sensor ambient temperature of the power amplifier;

dynamically changing by an adaptive power amplifier control processor a drain or collector voltage applied to the input of the power amplifier as a function of ambient temperature of the power amplifier measured by the temperature sensor to achieve a desired peak power when subjected to higher than normal ambient temperature;

digitally analyzing by a power amplifier spectral emissions mask (SEM) monitor a feedback signal of the power amplifier to determine power amplifier linearization performance; and dynamically changing by the adaptive power amplifier control processor the drain or collector voltage applied to the input of the power amplifier as a function of the determined linearization performance.

17. The computer program product of claim 16, wherein the power amplifier includes a power field effect transistor (FET), including one of a laterally diffused MOS (LDMOS) transistor, and a gallium nitride transistor, and further comprising dynamically changing by the adaptive power amplifier control processor the drain voltage applied to the input of the power amplifier.

18. The computer program product of claim 16, wherein the power amplifier includes a bipolar junction (BJ) transistor, and further comprising dynamically changing by the adaptive power amplifier control processor the collector voltage applied to the input of the power amplifier.

* * * * *